United States Patent
Pan et al.

(10) Patent No.: US 12,230,645 B2
(45) Date of Patent: Feb. 18, 2025

(54) STRETCHABLE PIXEL ARRAY SUBSTRATE

(71) Applicant: Au Optronics Corporation, Hsinchu (TW)

(72) Inventors: Yun-Wen Pan, Hsinchu (TW); Kung-Cheng Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 256 days.

(21) Appl. No.: 17/388,024

(22) Filed: Jul. 29, 2021

(65) Prior Publication Data
US 2022/0059577 A1 Feb. 24, 2022

Related U.S. Application Data

(60) Provisional application No. 63/068,435, filed on Aug. 21, 2020.

(30) Foreign Application Priority Data

Dec. 30, 2020 (TW) ................................ 109146912

(51) Int. Cl.
*H01L 27/12* (2006.01)
(52) U.S. Cl.
CPC ...... *H01L 27/1244* (2013.01); *H01L 27/1218* (2013.01)
(58) Field of Classification Search
CPC .................................................. H01L 27/1244
See application file for complete search history.

(56) References Cited

U.S. PATENT DOCUMENTS

| 9,601,557 B2 | 3/2017 | Yang et al. |
| 9,633,996 B1 | 4/2017 | Ge et al. |
| 9,799,708 B2 | 10/2017 | Hong et al. |

(Continued)

FOREIGN PATENT DOCUMENTS

| CN | 105977276 | 9/2016 |
| CN | 107221550 | 9/2017 |

(Continued)

OTHER PUBLICATIONS

"Office Action of India Counterpart Application", issued on Jun. 17, 2022, p. 1-p. 5.

*Primary Examiner* — Tucker J Wright
(74) *Attorney, Agent, or Firm* — JCIPRNET

(57) ABSTRACT

A stretchable pixel array substrate, including a base and a component layer, is provided. The base has multiple first openings and multiple second openings. Each of the first openings has a first opening extending direction. Each of the second openings has a second opening extending direction. The first opening extending direction and the second opening extending direction are different. The first openings and the second openings are alternately arranged in a first direction and a second direction to define multiple islands and multiple bridges of the base. The component layer is disposed on the base and includes multiple island portions and multiple bridge portions. The island potions have multiple pixel structures and are respectively disposed on the islands of the base. The bridge portions have conductive wires and are respectively disposed on the bridges of the base. The conductive wires are electrically connected to the pixel structures.

12 Claims, 10 Drawing Sheets

(56) References Cited

U.S. PATENT DOCUMENTS

| | | |
|---|---|---|
| 10,056,435 B2 | 8/2018 | Hong et al. |
| 10,135,011 B2 | 11/2018 | Park et al. |
| 10,310,560 B2 | 6/2019 | Choi et al. |
| 10,644,079 B2 | 5/2020 | Hong et al. |
| 10,649,496 B2 | 5/2020 | Choi et al. |
| 10,826,002 B2 | 11/2020 | Park et al. |
| 11,152,434 B2 | 10/2021 | Hong et al. |
| 2005/0017298 A1 | 1/2005 | Xie et al. |
| 2010/0025853 A1 | 2/2010 | Lindgren et al. |
| 2014/0138637 A1 | 5/2014 | Yang et al. |
| 2016/0172456 A1 | 6/2016 | Li et al. |
| 2016/0268352 A1 | 9/2016 | Hong et al. |
| 2017/0279057 A1 | 9/2017 | Park et al. |
| 2018/0040677 A1 | 2/2018 | Hong et al. |
| 2018/0046221 A1 | 2/2018 | Choi et al. |
| 2018/0052493 A1* | 2/2018 | Hong .................... G06F 1/1626 |
| 2018/0061743 A1* | 3/2018 | Hsu ...................... H05K 1/0283 |
| 2018/0358418 A1 | 12/2018 | Hong et al. |
| 2019/0088894 A1 | 3/2019 | Park et al. |
| 2019/0258297 A1 | 8/2019 | Choi et al. |
| 2020/0258951 A1 | 8/2020 | Hong et al. |
| 2021/0083211 A1 | 3/2021 | Park et al. |
| 2022/0013599 A1 | 1/2022 | Hong et al. |

FOREIGN PATENT DOCUMENTS

| | | |
|---|---|---|
| CN | 107731866 | 2/2018 |
| CN | 109036145 | 12/2018 |
| CN | 109378332 | 2/2019 |
| CN | 109817687 | 5/2019 |
| TW | 201427516 | 7/2014 |

* cited by examiner

STRETCHABLE PIXEL ARRAY SUBSTRATE

CROSS-REFERENCE TO RELATED APPLICATION

This application claims the priority benefit of U.S. Provisional Application No. 63/068,435, filed on Aug. 21, 2020 and Taiwan application serial no. 109146912, filed on Dec. 30, 2020. The entirety of each of the above-mentioned patent applications is hereby incorporated by reference herein and made a part of this specification.

BACKGROUND

Technical Field

The disclosure relates to a pixel array substrate, and particularly relates to a stretchable pixel array substrate.

Description of Related Art

With the rapid development of electronic technology, new electronic products continue to emerge. In order for electronic products to be applied in various different fields, the characteristics of stretchability, lightness and thinness, and unrestricted appearance are gradually being valued. In other words, electronic products are gradually required to have different appearances according to different application manners and application environments, so electronic products need to have stretchability.

However, when an electronic product is in a stretched state, the structure may break due to stress, which even further causes the internal circuit to break. Therefore, how to enable the stretchable electronic product to have good manufacturing yield and product reliability is an urgent issue to be solved at present.

SUMMARY

The disclosure provides a pixel array substrate, which does not crack easily.

The disclosure provides another pixel array substrate, which also does not crack easily.

The stretchable pixel array substrate of the disclosure includes a base and a component layer. The base has multiple first openings and multiple second openings. Each first opening has a first opening extending direction, each second opening has a second opening extending direction, and the first opening extending direction and the second opening extending direction are different. The first openings and the second openings are alternately arranged in a first direction and a second direction to define multiple islands and multiple bridges of the base. The first direction and the second direction are interlaced, the first direction and the first opening extending direction are interlaced, and the second direction and the second opening extending direction are interlaced. Each first opening has multiple opposite first edges and multiple opposite second edges, the first edges are arranged in the first direction, and the second edges are arranged in the first opening extending direction. Each second opening has multiple opposite third edges and multiple opposite fourth edges, the third edges are arranged in the second direction, and the fourth edges are arranged in the second opening extending direction. The component layer is disposed on the base and includes multiple island portions and multiple bridge portions. The island portions have multiple pixel structures and are respectively disposed on the islands of the base. The bridge portions have multiple conductive wires and are respectively disposed on the bridges of the base. The conductive wires are electrically connected to the pixel structures. The islands of the base include a first island and a second island, which are arranged in the first direction. The bridges of the base include a first bridge, which connects the first island and the second island. The island portions of the component layer include a first island portion and a second island portion, which are respectively disposed on the first island and the second island of the base and respectively have a first pixel structure and a second pixel structure of the pixel structures. The bridge portions of the component layer include a first bridge portion, which is disposed on the first bridge of the base and connects the first island portion and the second island portion of the component layer. The first bridge portion of the component layer has a first conductive wire of the conductive wires, and the first conductive wire electrically connects the first pixel structure and the second pixel structure. A first edge of the first opening of the base has a first segment defining the first island of the base. The first island portion of the component layer has an edge adjacent to the first opening. The first segment of the first edge of the first opening and the edge of the first island portion of the component layer have a first distance in the first direction, and the first distance gradually increases closer to the first bridge of the base.

Another stretchable pixel array substrate of the disclosure includes a base, a component layer, and multiple reinforcing structures. The base has multiple first openings and multiple second openings. Each first opening has a first opening extending direction, each second opening has a second opening extending direction, and the first opening extending direction and the second opening extending direction are different. The first openings and the second openings are alternately arranged in a first direction and a second direction to define multiple islands and multiple bridges of the base. The first direction and the second direction are interlaced, the first direction and the first opening extending direction are interlaced, and the second direction and the second opening extending direction are interlaced. Each first opening has multiple opposite first edges and multiple opposite second edges, the first edges are arranged in the first direction, and the second edges are arranged in the first opening extending direction. Each second opening has multiple opposite third edges and multiple opposite fourth edges, the third edges are arranged in the second direction, and the fourth edges are arranged in the second opening extending direction. The component layer is disposed on the base and includes multiple island portions and multiple bridge portions. The island portions have multiple pixel structures and are respectively disposed on the islands of the base. The bridge portions have multiple conductive wires and are respectively disposed on the bridges of the base. The conductive wires are electrically connected to the pixel structures. The reinforcing structures are disposed on the bridges of the base and are separated from the bridge portions of the component layer.

DETAILED DESCRIPTION OF DISCLOSED EMBODIMENTS

Figure 1:
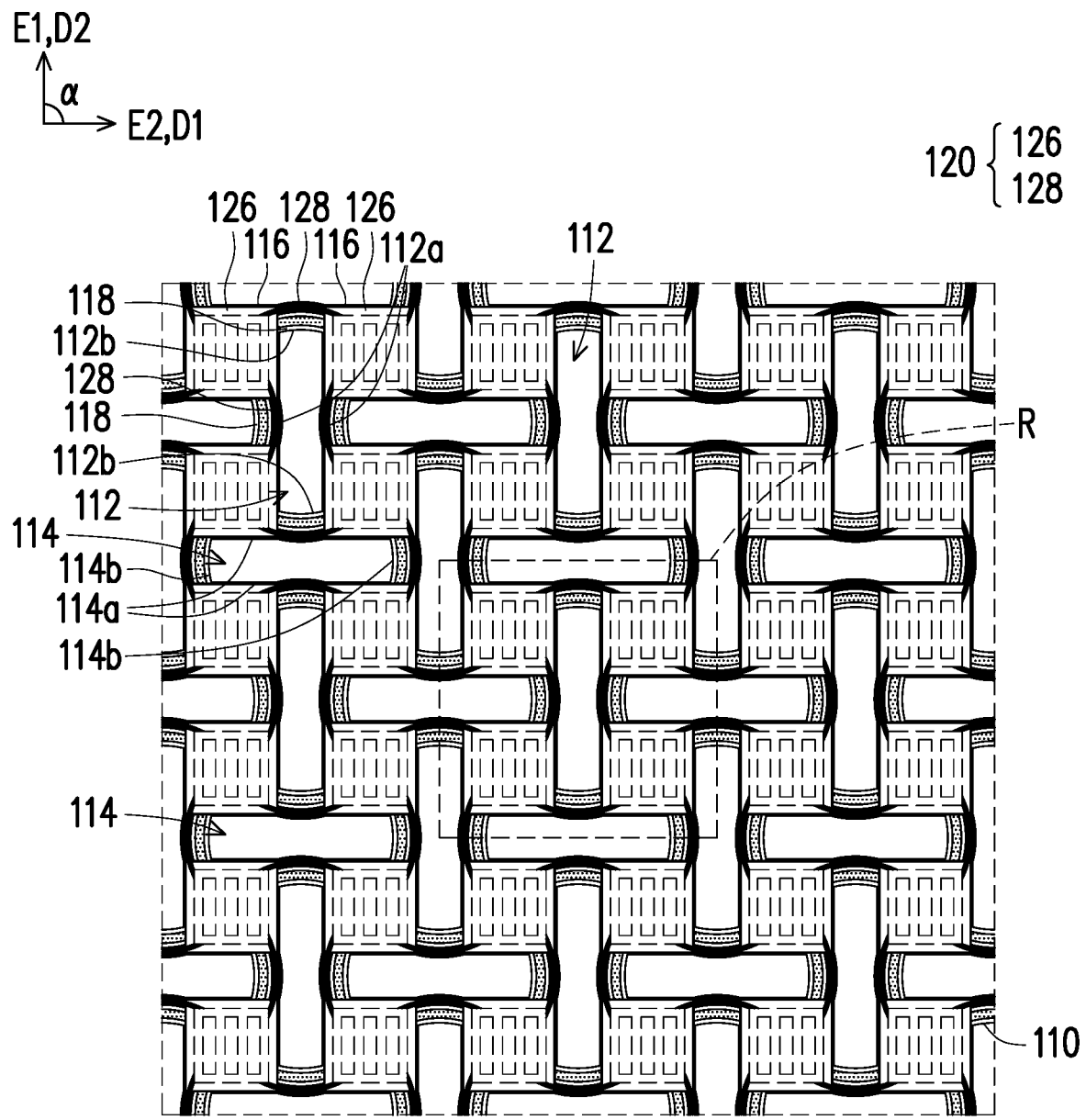
FIG. 1 is a top schematic view of a stretchable pixel array substrate 100 according to an embodiment of the disclosure.

Reference will now be made in detail to the exemplary embodiments of the disclosure, and examples of the exemplary embodiments are illustrated in the accompanying drawings. Whenever possible, the same reference numerals are used in the drawings and description to represent the same or similar parts.

It should be understood that when a component such as a layer, a film, a region, or a substrate is referred to as being "on" or "connected to" another component, the component may be directly on or connected to the another component or there may also be an intermediate component present. In contrast, when a component is referred to as being "directly on" or "directly connected to" another component, there is no intermediate component. As used herein, "connection" may refer to physical and/or electrical connection. Furthermore, there may be another component present between two components for "electrical connection" or "coupling".

As used herein, "about", "approximately", or "substantially" includes the stated value and an average value within an acceptable range of deviation from a specific value determined by persons skilled in the art considering the measurement in discussion and specific amount of measurement-related errors (that is, the limitation of a measurement system). For example, "about" may represent being within one or more standard deviations, ±30%, ±20%, ±10%, or ±5% of the stated value. Furthermore, "about", "approximately", or "substantially" used herein may select a more acceptable range of deviation or standard deviation according to optical properties, etching properties, or other properties instead of using one standard deviation for all properties.

Unless otherwise defined, all terms (including technical and scientific terms) used herein have the same meanings as commonly understood by persons skilled in the art to which the disclosure belongs. It will be further understood that terms such as terms defined in conventional dictionaries should be interpreted as having meanings consistent with the meanings in the related art and the context of the disclosure and will not be interpreted as having idealized or overly formal meanings, unless explicitly defined in the disclosure.

FIG. 1 is a top schematic view of a stretchable pixel array substrate 100 according to an embodiment of the disclosure. Please refer to FIG. 1. The stretchable pixel array substrate 100 includes multiple repeating units R arranged in an array.

Figure 2:
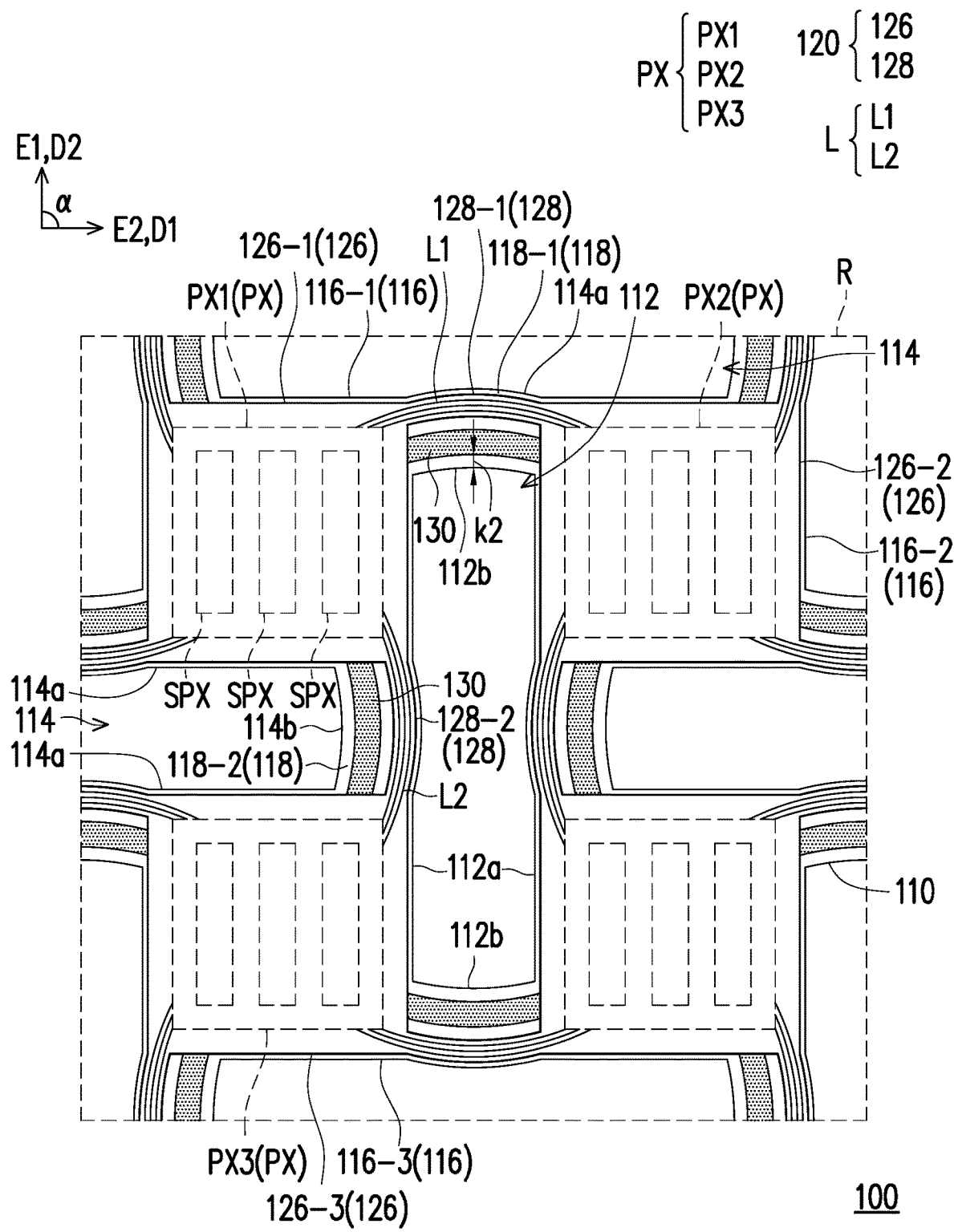
FIG. 2 is an enlarged schematic view of a repeating unit R of the stretchable pixel array substrate 100 according to an embodiment of the disclosure.

FIG. 2 is an enlarged schematic view of the repeating unit R of the stretchable pixel array substrate 100 according to an embodiment of the disclosure.

Figure 3:
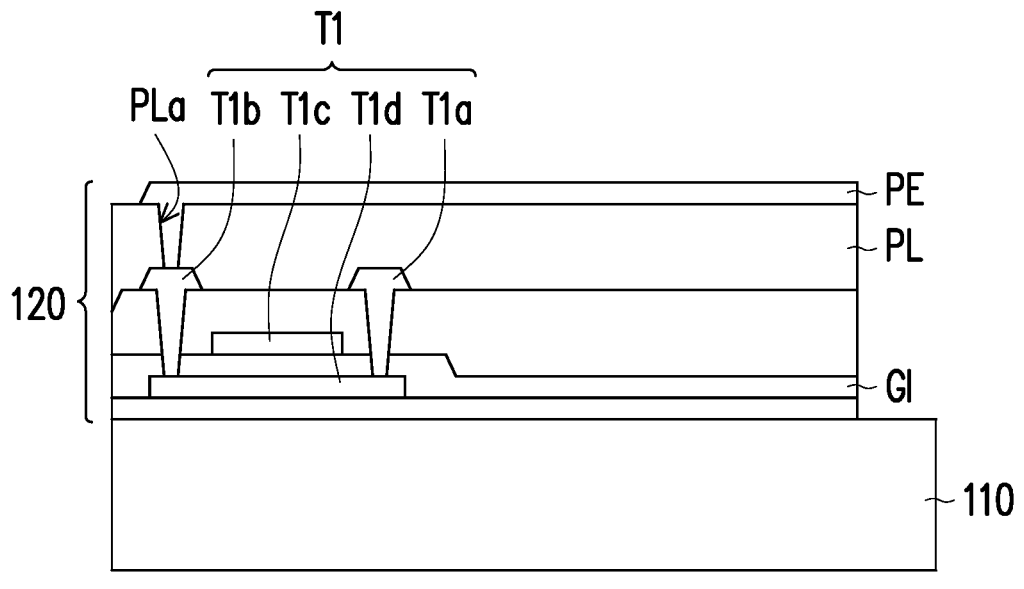
FIG. 3 is a cross-sectional schematic view of the stretchable pixel array substrate 100 according to an embodiment of the disclosure.

FIG. 3 is a cross-sectional schematic view of the stretchable pixel array substrate 100 according to an embodiment of the disclosure.

Please refer to FIG. 1, FIG. 2 and FIG. 3. The stretchable pixel array substrate 100 includes a base 110 configured to support other members of the stretchable pixel array substrate 100. The base 110 has elasticity and malleability. In other words, the base 110 may be stretched. For example, in the embodiment, the material of the base 110 may include polyimide (PI), polyethylene naphthalate (PEN), polyethylene terephthalate (PET), polycarbonates (PC), polyether sulfone (PES), polyarylate, other suitable materials, or a combination of at least two of the foregoing materials, but the disclosure is not limited thereto.

Please refer to FIG. 1 and FIG. 2. The base 110 has multiple first openings 112 and multiple second openings 114. Each first opening 112 has a first opening extending direction E1, each second opening 114 has a second opening extending direction E2, and the first opening extending direction E1 and the second opening extending direction E2 are different. For example, in the embodiment, the first opening extending direction E1 and the second opening extending direction E2 may be selectively perpendicular. In other words, in the embodiment, an included angle α of the first opening extending direction E1 and the second opening extending direction E2 may be 90°. However, the disclosure is not limited thereto. In other embodiments, the included angle α of the first opening extending direction E1 and the second opening extending direction E2 may also be other angles greater than 0° and less than 180°.

Please refer to FIG. 1 and FIG. 2. The first openings 112 and the second openings 114 of the base 110 are alternately arranged in a first direction D1 and a second direction D2 to define multiple islands 116 and multiple bridges 118 of the base 110. The first direction D1 and the second direction D2 are interlaced, the first direction D1 and the first opening extending direction E1 are interlaced, and the second direction D2 and the second opening extending direction E2 are interlaced. For example, in the embodiment, the first direction D1 and the second direction D2 may be selectively perpendicular, the first direction D1 and the first opening extending direction E1 may be selectively perpendicular, and the second direction D2 and the second opening extending direction E2 may be selectively perpendicular, but the disclosure is not limited thereto.

Please refer to FIG. 1 and FIG. 2. Each first opening 112 has multiple opposite first edges 112a and multiple opposite second edges 112b, the first edges 112a are arranged in the first direction D1, and the second edges 112b are arranged in the first opening extending direction E1. Each second opening 114 has multiple opposite third edges 114a and multiple opposite fourth edges 114b, the third edges 114a are arranged in the second direction D2, and the fourth edges 114b are arranged in the second opening extending direction E2.

For example, in the embodiment, the first opening 112 may have a rectangle-like shape, the first edge 112a of the first opening 112 may be a long side of the rectangle-like shape, and the second edge 112b of the first opening 112 may be a short side of the rectangle-like shape. However, the disclosure is not limited thereto. In other embodiments, the first opening 112 may not have a rectangle-like shape or a rectangle shape and may have, for example, an oval-like shape or other shapes.

For example, in the embodiment, the second opening 114 may have a rectangle-like shape, the third edge 114a of the second opening 114 may be a long side of the rectangle-like shape, and the fourth edge 114b of the second opening 114 may be a short side of the rectangle-like shape. However, the disclosure is not limited thereto. In other embodiments, the second opening 114 may not have a rectangle-like shape or a rectangle shape and may have, for example, an oval-like shape or other shapes.

Please refer to FIG. 2. In the embodiment, each bridge 118 of the base 110 is defined by the second edge 112b of the corresponding first opening 112 and the third edge 114a of the corresponding second opening 114 or is defined by the first edge 112a of the corresponding first opening 112 and the fourth edge 114b of the corresponding second opening 114. Specifically, in the embodiment, the bridges 118 of the base 110 include multiple first bridges 118-1 and multiple second bridges 118-2. Each first bridge 118-1 substantially extends in the first direction D1. Each second bridge 118-2 substantially extends in the second direction D2. Each first bridge 118-1 may be defined by the second edge 112b of the corresponding first opening 112 and the third edge 114a of the corresponding second opening 114. Each second bridge 118-2 may be defined by the first edge 112a of the corresponding first opening 112 and the fourth edge 114b of the corresponding second opening 114.

Please refer to FIG. 1, FIG. 2, and FIG. 3. The stretchable pixel array substrate 100 further includes a component layer 120 disposed on the base 110. Please refer to FIG. 1 and FIG. 2. The component layer 120 includes multiple island portions 126. Please refer to FIG. 2. The island portions 126 of the component layer 120 have multiple pixel structures PX and are respectively disposed on the islands 116 of the base 110.

Please refer to FIG. 2. For example, in the embodiment, an island portion 126 of the component layer 120 may be disposed on the island 116 of the base 110. Each island portion 126 has at least one pixel structure PX, and each pixel structure PX includes at least one subpixel structure SPX. For example, in the embodiment, the island portion 126 of the component layer 120 may have one pixel structure PX, and the pixel structure PX may include three subpixel structures SPX respectively configured to display red, blue, and green, but the disclosure is not limited thereto.

Figure 4:
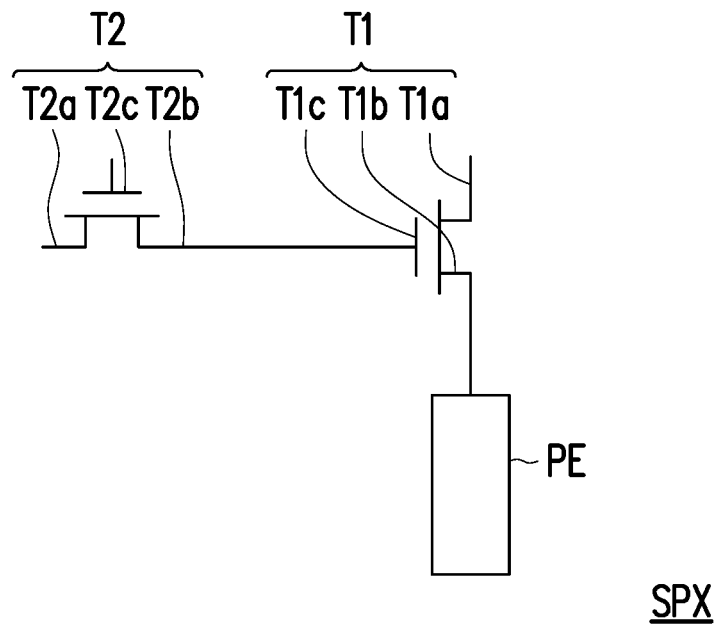
FIG. 4 is a schematic view of an equivalent circuit of a subpixel structure SPX of the stretchable pixel array substrate 100 according to an embodiment of the disclosure.

FIG. 4 is a schematic view of an equivalent circuit of the subpixel structure SPX of the stretchable pixel array substrate 100 according to an embodiment of the disclosure.

Please refer to FIG. 2, FIG. 3, and FIG. 4. In the embodiment, each subpixel structure SPX may include a first transistor T1 and a pixel electrode PE. The first transistor T1 has a first terminal T1a, a second terminal T1b, a control terminal T1c, and a semiconductor pattern T1d. The first terminal T1a and the second terminal T1b are respectively electrically connected to two different regions of the semiconductor pattern T1d. A first insulating layer GI is sandwiched between the control terminal T1c and the semiconductor pattern T1d of the first transistor T1. A second insulating layer PL is sandwiched between the first transistor T1 and the pixel electrode PE. The pixel electrode PE is electrically connected to the second terminal T1b of the first transistor T1 through a contact window PLa of the second insulating layer PL. In the embodiment, each subpixel structure SPX may selectively further include a second transistor T2 (shown in FIG. 4). The second transistor T2 has a first terminal T2a, a second terminal T2b, and a control terminal T2c. The second terminal T2b of the second transistor T2 is electrically connected to the control terminal T1c of the first transistor T1. However, the disclosure is not limited thereto.

Please refer to FIG. 1 and FIG. 2. The component layer 120 further includes multiple bridge portions 128. Please refer to FIG. 2. The bridge portions 128 of the component layer 120 have multiple conductive wires L and are respectively disposed on the bridges 118 of the base 110. The conductive wires L are electrically connected to the pixel structures PX.

Please refer to FIG. 2. In the embodiment, the bridge portions 128 of the component layer 120 include multiple first bridge portions 128-1 and multiple second bridge portions 128-2. The first bridge portions 128-1 and the second bridges 128-2 of the component layer 120 are respectively disposed on the first bridges 118-1 and the second bridges 118-2 of the base 11. Each first bridge portion 128-1 substantially extends in the first direction D1. Each second bridge portion 128-2 substantially extends in the second direction D2. The conductive wires L include multiple first conductive wires L1 and multiple second conductive wires L2. The first bridge portions 128-1 of the component layer 120 have the first conductive wires L1. The second bridge portions 128-2 of the component layer 120 have the second conductive wires L2.

Please refer to FIG. 2 and FIG. 4. For example, in the embodiment, the first conductive wires L1 may include a gate driving line electrically connected to the control terminal T2c of the second transistor T2 of the subpixel structure SPX, a first common line, and a first power line electrically connected to the first terminal T1a of the first transistor T1 of the subpixel structure SPX. The second conductive wires L2 may include a data line electrically connected to the first terminal T2a of the second transistor T2 of the subpixel structure SPX, a second common line, and a second power line electrically connected to the first terminal T1a of the first transistor T1 of the subpixel structure SPX. However, the disclosure is not limited thereto.

Please refer to FIG. 2. In the embodiment, each bridge portion 128 of the component layer 120 is close to the third edge 114a of the corresponding second opening 114 and is away from the second edge 112b of the corresponding first opening 112 or is close to the first edge 112a of the corresponding first opening 112 and is away from the fourth edge 114b of the corresponding second opening 114.

For example, in the embodiment, each first bridge portion 128-1 of the component layer 120 is close to the third edge 114a of the corresponding second opening 114 and is away from the second edge 112b of the corresponding first opening 112. Each second bridge portion 128-2 of the component layer 120 is close to the first edge 112a of the corresponding first opening 112 and is away from the fourth edge 114b of the corresponding second opening 114. In other words, in this embodiment, each bridge portion 128 of the component layer 120 is defined by the first opening 112 and the second opening 114, and each bridge portion 128 is close to a long side of one of the first opening 112 and the second opening 114 and is away from a short side of the other one of the first opening 112 and the second opening 114, but the disclosure is not limited thereto.

Please refer to FIG. 2. It is worth noting that in the embodiment, the stretchable pixel array substrate 100 further includes multiple reinforcing structures 130 disposed on the bridges 118 of the base 110 and separated from the bridge portions 128 of the component layer 120. The reinforcing structure 130 may adjust the position of a neutral axis, so that the bridge portion 128 of the component layer 120 bears a compressive stress instead of a tensile stress. As such, the risk of disconnection of the conductive wire L of the bridge portion 128 may be greatly reduced. In addition, since the reinforcing structure 130 is separated from the bridge portion 128 of the component layer 120, even if a crack occurs in the reinforcing structure 130, the crack may not easily extend to the bridge portion 128 of the component layer 120, causing the conductive wire L to be disconnected.

For example, in the embodiment, the reinforcing structure 130 may include an inorganic layer, a metal layer, or a combination thereof, but the disclosure is not limited thereto.

In the embodiment, one reinforcing structure 130 may selectively electrically connect adjacent two of the island portions 126 of the component layer 120 to transmit a certain type of electronic signal. If the conductive wire L of the component layer 120 adjacent to the reinforcing structure 130 is disconnected, the reinforcing structure 130 may be used as a spare conductive wire, so that the certain type of electronic signal can still be transmitted smoothly.

Please refer to FIG. 2. For example, in the embodiment, the islands 116 of the base 110 include a first island 116-1 and a second island 116-2 arranged in the first direction D1. The bridges 118 of the base 110 include a first bridge 118-1 connecting the first island 116-1 and the second island 116-2. The island portions 126 of the component layer 120 include a first island portion 126-1 and a second island portion 126-2. The first island portion 126-1 and the second island portion 126-2 of the component layer 120 are respectively disposed on the first island 116-1 and the second island 116-2 of the base 110 and respectively have a first pixel structure PX1 and a second pixel structure PX2 of the pixel structures PX. The bridge portions 128 of the component layer 120 include a first bridge portion 128-1. The first bridge portion 128-1 is disposed on the first bridge 118-1 of the base 110 and connects the first island portion 126-1 and the second island portion 126-2 of the component layer 120. The islands 116 of the base 110 further include a third island 116-3. The first island 116-1 and the third island 116-3 are arranged in the second direction D2. The island portions 126 of the component layer 120 further include a third island portion 126-3 disposed on the third island 116-3 of the base 110 and having a third pixel structure PX3 of the pixel structures PX. The bridges 118 of the base 110 include a second bridge 118-2 connecting the first island 116-1 and the third island 116-3 of the base 110. The bridge portions 128 of the component layer 120 further include a second bridge portion 128-2 disposed on the second bridge 118-2 of the base 110 and connecting the first island portion 126-1 and the third island portion 126-3 of the component layer 120. The second bridge portion 128-2 of the component layer 120 has the second conductive wire L2 of the conductive wires L. The second conductive wire L2 electrically connects the first pixel structure PX1 and the third pixel structure PX3.

For example, in this embodiment, the second bridge portion 128-2 of the component layer 120 has the second conductive wire L2 of the conductive wires L, and the second conductive wire L2 is used as, for example, a data line. Please refer to FIG. 2 and FIG. 4. The reinforcing structure 130 disposed on the second bridge 118-2 is, for example, a spare data line, which electrically connects the first terminal T2a of the second transistor T2 of the subpixel structure SPX of the first pixel structure PX1 and the first terminal T2a of the second transistor T2 of the subpixel structure SPX of the third pixel structure PX3. If the second conductive wire L2 used as the data line of the component layer 120 is disconnected, the reinforcing structure 130 may function as the spare data line, so that a data signal can still be transmitted smoothly. However, the disclosure is not limited thereto. In other embodiments, the reinforcing structure 130 disposed on the second bridge 118-2 may also be used as the spare conductive wire for transmitting other types of electronic signals.

For example, in this embodiment, the first bridge portion 128-1 of the component layer 120 has the first conductive wire L1 of the conductive wires L, and the first conductive wire L1 is used as, for example, a gate driving line. Please refer to FIG. 2 and FIG. 4. The reinforcing structure 130 disposed on the first bridge 118-1 is, for example, a spare gate driving line, which electrically connects the control terminal T2c of the second transistor T2 of the subpixel structure SPX of the first pixel structure PX1 and the control terminal T2c of the second transistor T2 of the subpixel structure SPX of the second pixel structure PX2. If the first conductive wire L1 used as the gate driving line of the component layer 120 is disconnected, the reinforcing structure 130 may function as the spare gate driving line, so that a gate driving signal can still be transmitted smoothly. However, the disclosure is not limited thereto. In other embodiments, the reinforcing structure 130 disposed on the first bridge 118-1 may also be used as the spare conductive wire for transmitting other types of electronic signals.

Please refer to FIG. 2. In this embodiment, each reinforcing structure 130 may be selectively connected to adjacent two of the island portions 126 of the component layer 120, but the disclosure is not limited thereto. In addition, in this embodiment, the reinforcing structure 130 and the second edge 112b of the first opening 112 may have a distance k2 in the second direction D2. For example, the distance k2 may be greater than 3 μm, but the disclosure is not limited thereto.

It must be noted here that the following embodiments continue to use the reference numerals and some content of the foregoing embodiment. The same reference numerals are adopted to represent the same or similar components, and the description of the same technical content is omitted. For the description of the omitted parts, reference may be made to the foregoing embodiment, which will not be repeated in the following embodiments.

Figure 5:
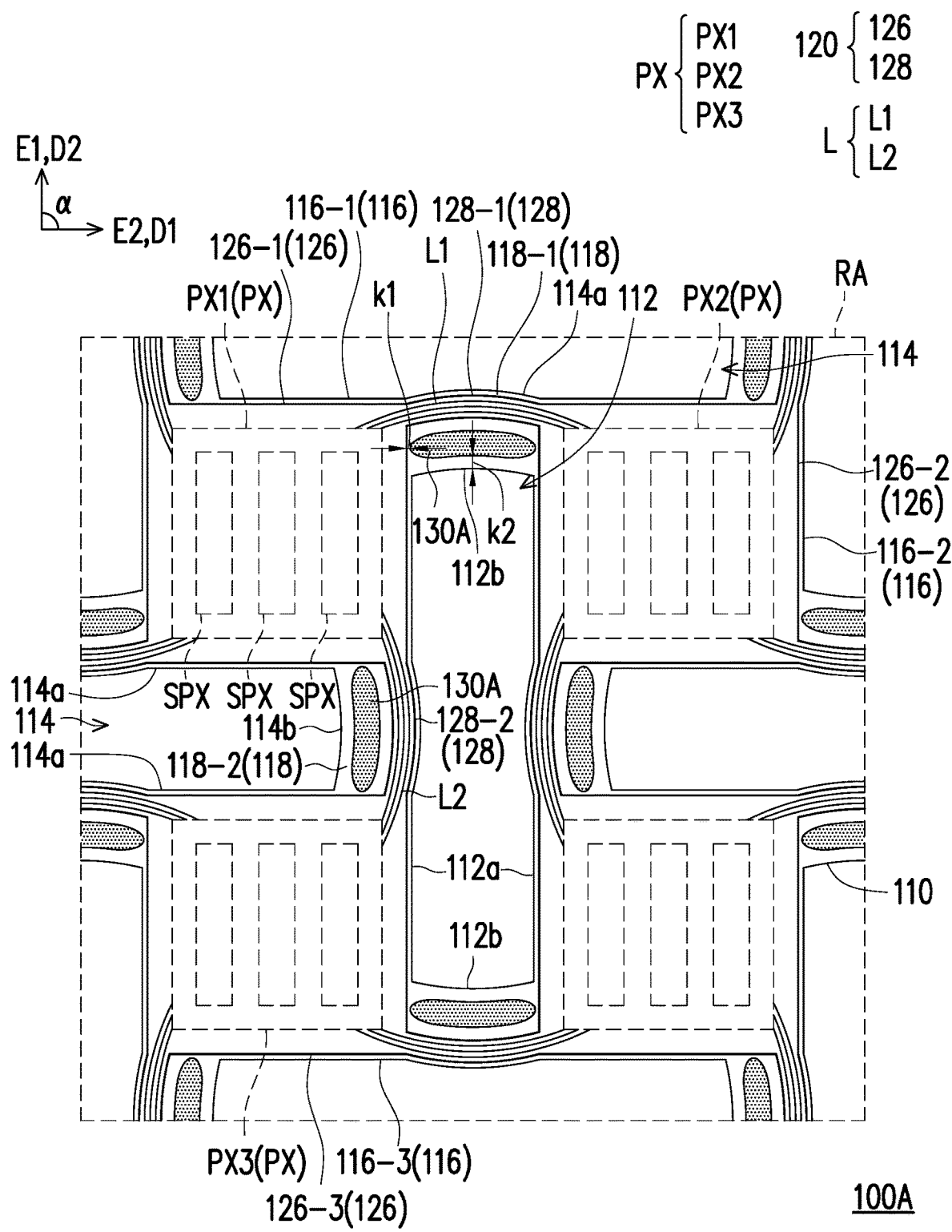
FIG. 5 is an enlarged schematic view of a repeating unit RA of a stretchable pixel array substrate 100A according to an embodiment of the disclosure.

FIG. 5 is an enlarged schematic view of a repeating unit RA of a stretchable pixel array substrate 100A according to an embodiment of the disclosure.

Please refer to FIG. 5. Persons skilled in the art know that the stretchable pixel array substrate 100A may be composed of multiple repeating units RA arranged in an array. FIG. 5 only shows one repeating unit RA as a representative and the repeating units RA arranged in the array are omitted here.

The stretchable pixel array substrate 100A of FIG. 5 is similar to the stretchable pixel array substrate 100 of FIG. 2, and the difference between the two is that a reinforcing structure 130A of the stretchable pixel array substrate 100A of FIG. 5 and the reinforcing structure 130 of the stretchable pixel array substrate 100 of FIG. 2 are different.

Please refer to FIG. 5. Specifically, in the embodiment, each reinforcing structure 130A is isolated from adjacent two of multiple island portions 126 of a component layer 120. In the embodiment, the reinforcing structure 130A and any one of the adjacent two of the island portions 126 of the component layer 120 has a distance k1 in a first direction D1. For example, in the embodiment, the distance k1 may be greater than 3 µm, but the disclosure is not limited thereto. In addition, in the embodiment, the reinforcing structure 130A and a second edge 112b of a first opening 112 may have a distance k2 in a second direction D2. For example, the distance k2 may be greater than 3 µm, but the disclosure is not limited thereto.

Figure 6:
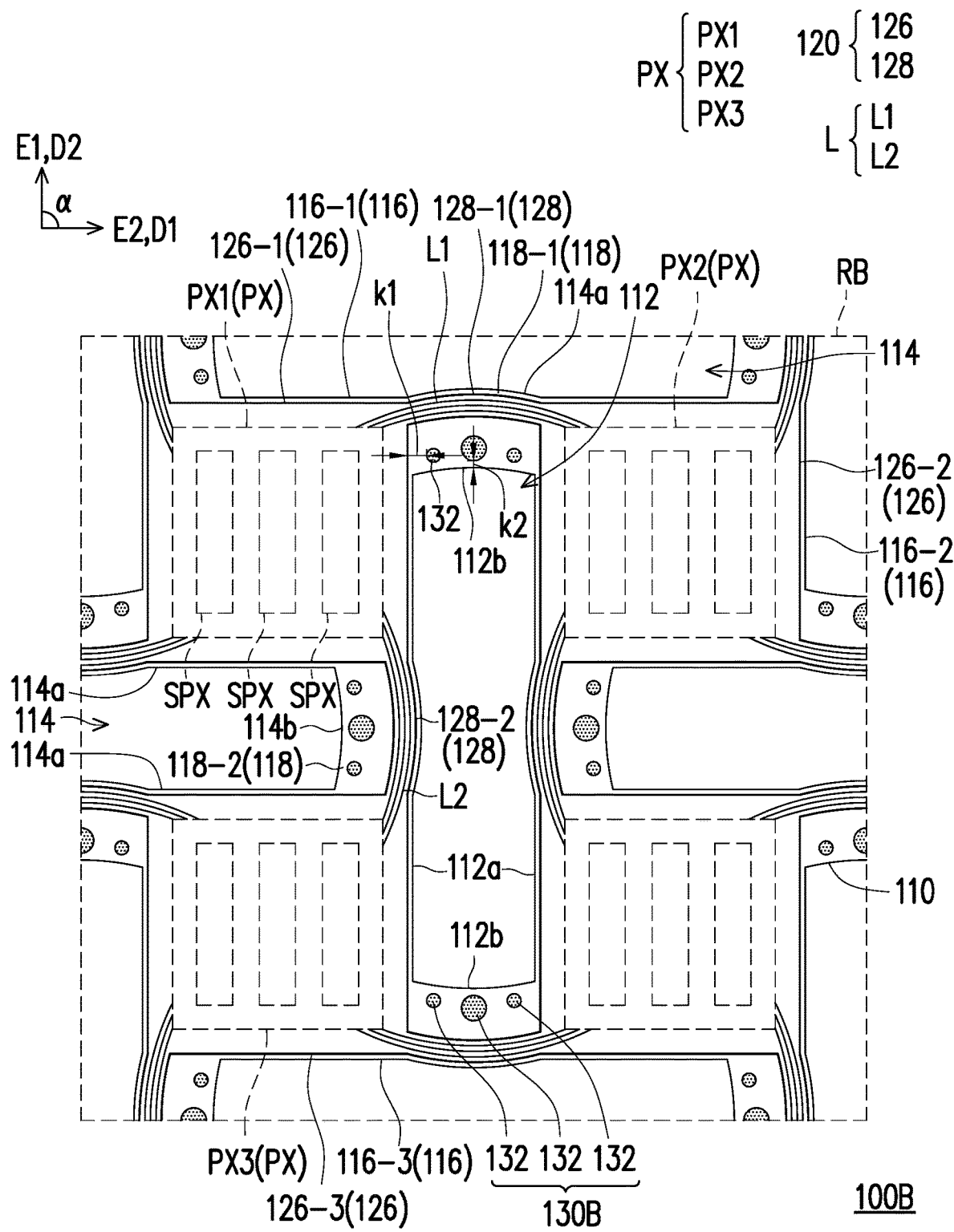
FIG. 6 is an enlarged schematic view of a repeating unit RB of a stretchable pixel array substrate 100B according to an embodiment of the disclosure.

FIG. 6 is an enlarged schematic view of a repeating unit RB of a stretchable pixel array substrate 100B according to an embodiment of the disclosure.

Please refer to FIG. 6. Persons skilled in the art know that the stretchable pixel array substrate 100B may be composed of multiple repeating units RB arranged in an array. FIG. 6 only shows one repeating unit RB as a representative and the repeating units RB arranged in the array are omitted here.

The stretchable pixel array substrate 100B of FIG. 6 is similar to the stretchable pixel array substrate 100A of FIG. 5, and the difference between the two is that a reinforcing structure 130B of the stretchable pixel array substrate 100B of FIG. 6 and the reinforcing structure 130A of the stretchable pixel array substrate 100A of FIG. 5 are different. Please refer to FIG. 6. Specifically, in the embodiment, each reinforcing structure 130B may include multiple reinforcing patterns 132 apart from each other. In the embodiment, the reinforcing pattern 132 closest to an island portion 126 of a component layer 120 and the island portion 126 of the component layer 120 have a distance k1 in a first direction D1. For example, in the embodiment, the distance k1 may be greater than 3 µm, but the disclosure is not limited thereto. In addition, in the embodiment, any reinforcing pattern 132 and a second edge 112b of a first opening 112 may have a distance k2 in a second direction D2. For example, the distance k2 may be greater than 3 µm, but the disclosure is not limited thereto.

Figure 7:
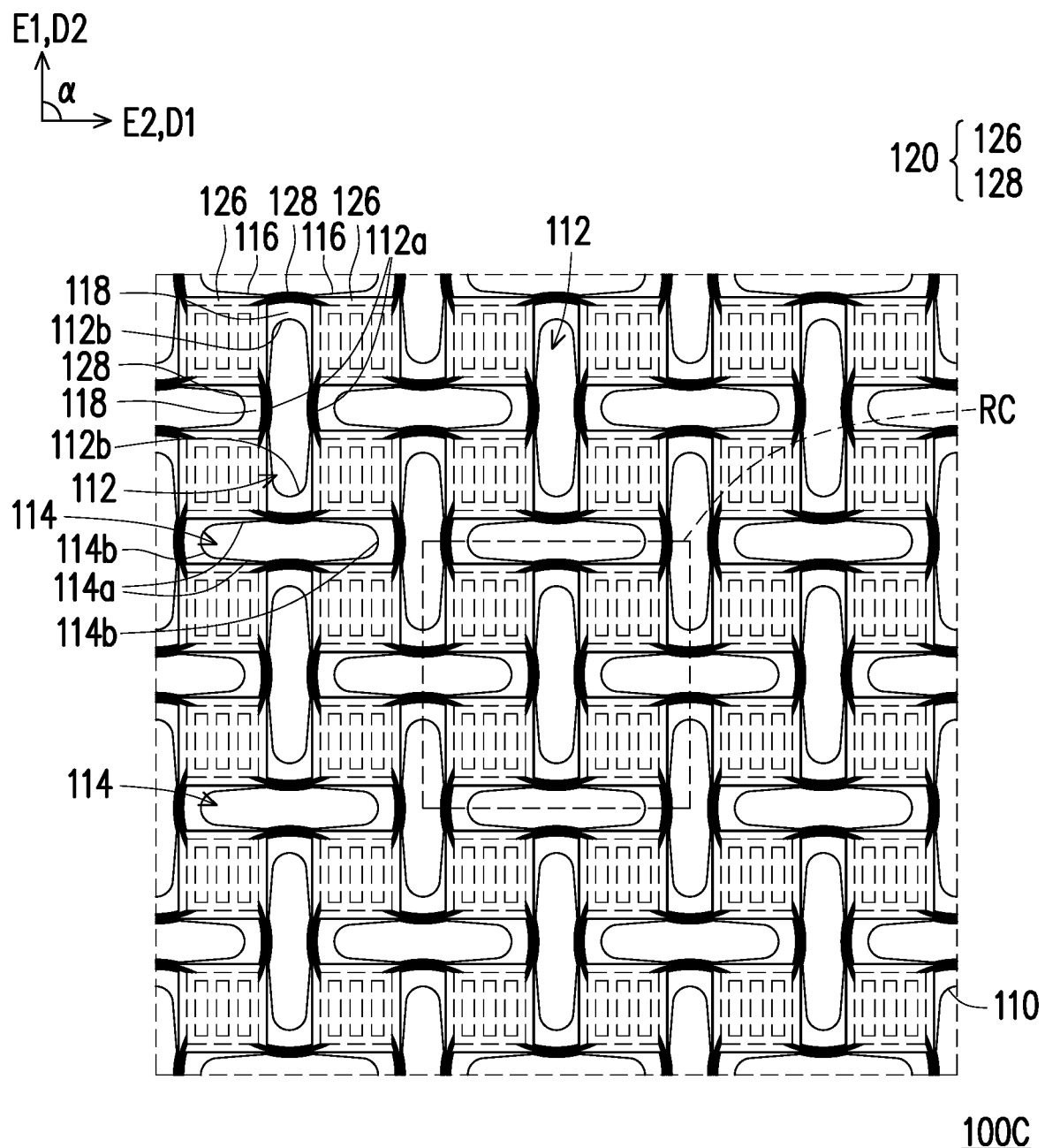
FIG. 7 is a top schematic view of a stretchable pixel array substrate 100C according to an embodiment of the disclosure.

FIG. 7 is a top schematic view of a stretchable pixel array substrate 100C according to an embodiment of the disclosure. Please refer to FIG. 7. The stretchable pixel array substrate 100C includes multiple repeating units RC arranged in an array.

Figure 8:
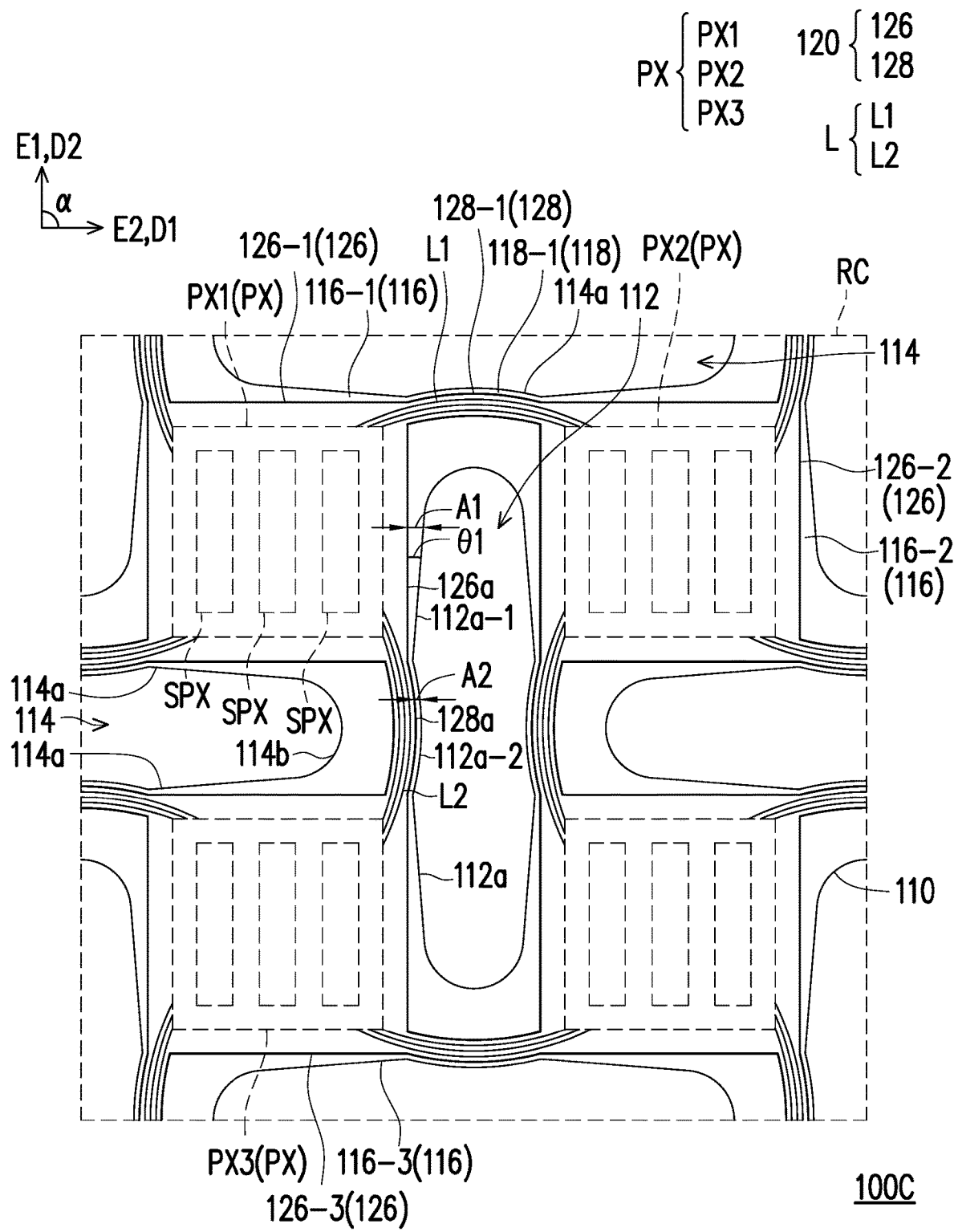
FIG. 8 is an enlarged schematic view of a repeating unit RC of the stretchable pixel array substrate 100C according to an embodiment of the disclosure.

FIG. 8 is an enlarged schematic view of the repeating unit RC of the stretchable pixel array substrate 100C according to an embodiment of the disclosure.

Figure 9:
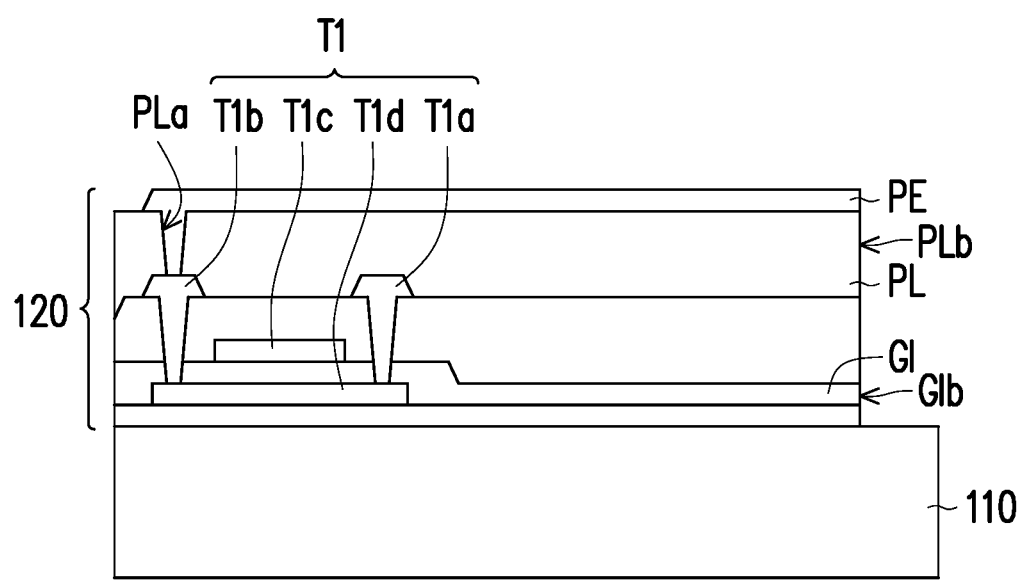
FIG. 9 is a cross-sectional schematic view of the stretchable pixel array substrate 100C according to an embodiment of the disclosure.

FIG. 9 is a cross-sectional schematic view of the stretchable pixel array substrate 100C according to an embodiment of the disclosure.

The stretchable pixel array substrate 100C of FIG. 7 to FIG. 9 is similar to the stretchable pixel array substrate 100 of FIG. 1 to FIG. 4, and the difference between the two is that the shape of a region of a base 110 of the stretchable pixel array substrate 100C exposed by a component layer 120 and the shape of a region exposed by the component layer 120 of the base 110 of the stretchable pixel array substrate 100 are different. In addition, the stretchable pixel array substrate 100C of FIG. 7 to FIG. 9 may selectively not include the reinforcing structure 130 of the stretchable pixel array substrate 100 of FIG. 1 to FIG. 4.

Please refer to FIG. 7 and FIG. 8. Specifically, in the embodiment, a first edge 112a of a first opening 112 of the base 110 has a first segment 112a-1 defining a first island 116-1 of the base 110. A first island portion 126-1 of the component layer 120 has an edge 126a adjacent to the first opening 112. The first segment 112a-1 of the first edge 112a of the first opening 112 and the edge 126a of the first island portion 126-1 of the component layer 120 have a first distance A1 in a first direction D1.

It is worth noting that the first distance A1 gradually increases closer to a first bridge 118-1 of the base 110. In other words, the first segment 112a-1 of the first edge 112a of the first opening 112 and the edge 126a of the first island portion 126-1 of the component layer 120 have an acute angle θ1. In this way, the tensile stress on the inner side of the first bridge 118-1 (that is, the side close to the first opening 112) may be evenly distributed, thereby reducing the probability of a conductive wire L disposed on the first bridge 118-1 being disconnected.

Please refer to FIG. 8 and FIG. 9. It should be noted that the edge 126a of the component layer 120 refers to the edge of the entire film layer of the component layer 120. For example, in the embodiment, the edge 126a of the component layer 120 may refer to an edge GIb of a first insulating layer GI, an edge PLb of a second insulating layer PL, or a combination thereof, but the disclosure is not limited thereto.

Please refer to FIG. 8. In the embodiment, the first edge 112a of the first opening 112 further includes a second segment 112a-2. The second segment 112a-2 of the first edge 112a of the first opening 112 and a fourth edge 114b of a second opening 114 define a second bridge 118-2 of the base 110. The second segment 112a-2 of the first edge 112a of the first opening 112 and an edge 128a of a second bridge 128-2 of the component layer 120 have a second distance A2. The first distance A1 is greater than the second distance A2. For example, in the embodiment, the first distance A1 may be greater than 3 µm and the second distance A2 may be less than 5 µm, but the disclosure is not limited thereto.

In addition, in the embodiment, the second segment 112a-2 of the first edge 112a of the first opening 112 may include a curve. The second edge 112b of the first opening 112 may include a curve. The fourth edge 114b of the second opening 114 may include a curve. However, the disclosure is not limited thereto. In the embodiment, the conductive wire L and/or a bridge portion 128 may be selectively curved, but the disclosure is not limited thereto.

Figure 10:
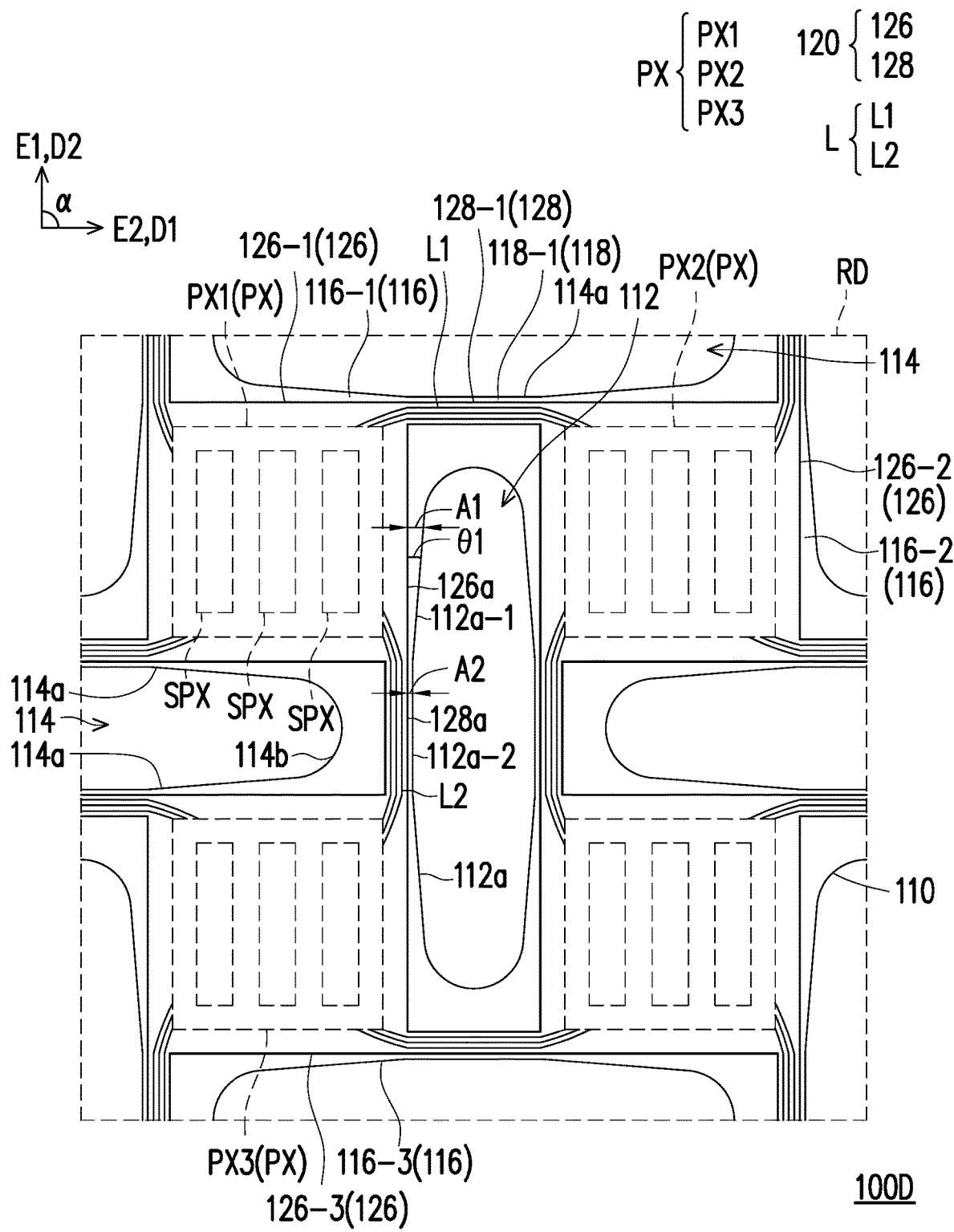
FIG. 10 is an enlarged schematic view of a repeating unit RD of a stretchable pixel array substrate 100D according to an embodiment of the disclosure.

FIG. 10 is an enlarged schematic view of a repeating unit RD of a stretchable pixel array substrate 100D according to an embodiment of the disclosure.

Please refer to FIG. 10. Persons skilled in the art know that the stretchable pixel array substrate 100D may be composed of multiple repeating units RD arranged in an array. FIG. 10 only shows one repeating unit RD as a representative and the repeating units RD arranged in the array are omitted here.

The stretchable pixel array substrate 100D of the embodiment is similar to the stretchable pixel array substrate 100C, and the difference between the two is that in the embodiment of FIG. 10, a conductive wire L and/or a bridge portion 128 may be selectively linear.

Figure 11:
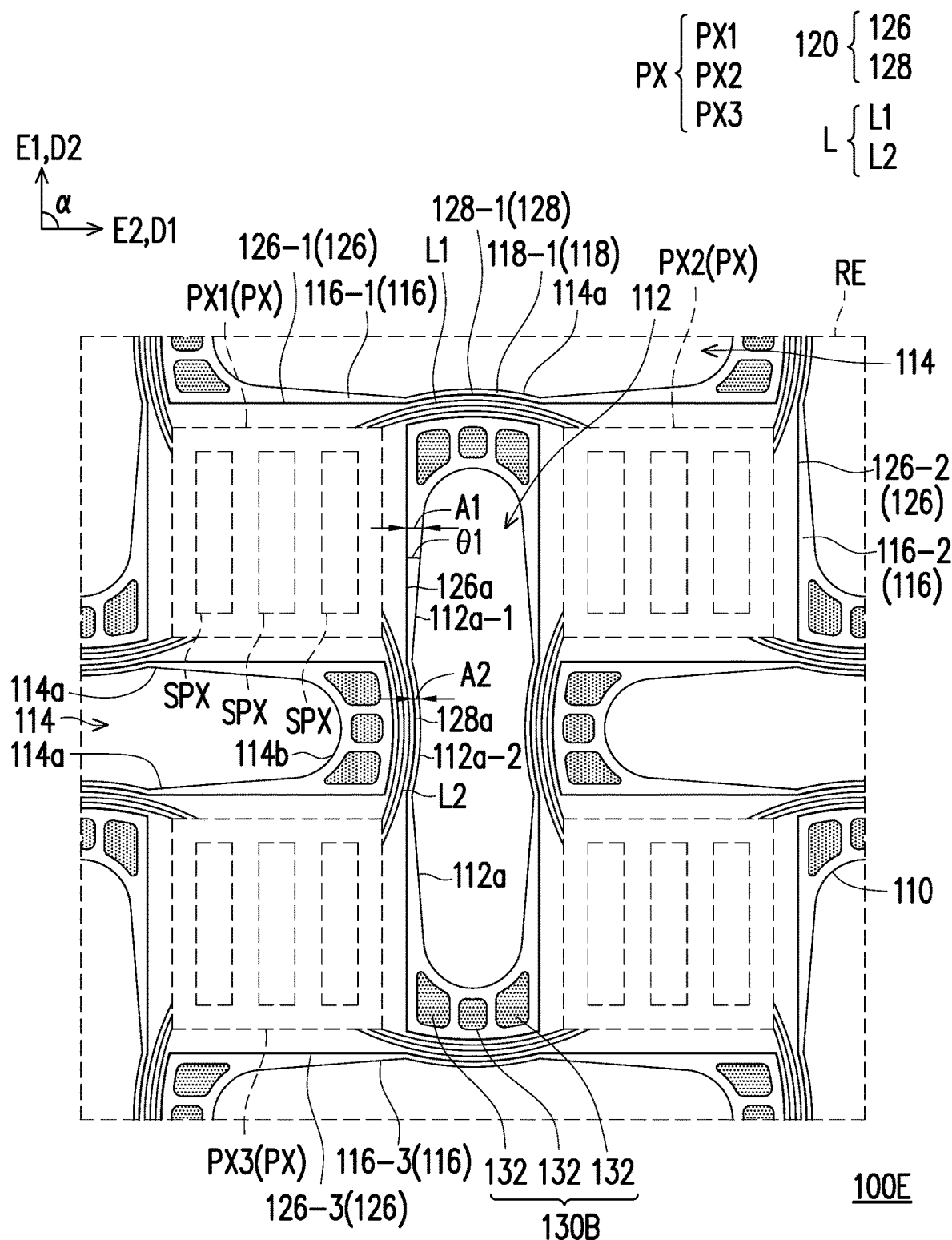
FIG. 11 is an enlarged schematic view of a repeating unit RE of a stretchable pixel array substrate 100E according to an embodiment of the disclosure.

FIG. 11 is an enlarged schematic view of a repeating unit RE of a stretchable pixel array substrate 100E according to an embodiment of the disclosure.

Please refer to FIG. 11. Persons skilled in the art know that the stretchable pixel array substrate 100E may be composed of multiple repeating units RE arranged in an array. FIG. 11 only shows one repeating unit RE as a representative and the repeating units RE arranged in the array are omitted here.

The stretchable pixel array substrate 100E of the embodiment is similar to the stretchable pixel array substrate 100C, and the difference between the two is that in the embodiment of FIG. 11, the stretchable pixel array substrate 100E further includes a reinforcing structure 130B.

What is claimed is:

1. A stretchable pixel array substrate, comprising:
a base, having a plurality of first openings and a plurality of second openings, wherein each of the first openings has a first opening extending direction, and each of the second openings has a second opening extending direction, and the first opening extending direction and the second opening extending direction are different; the first openings and the second openings are alternately arranged in a first direction and a second direction to define a plurality of islands and a plurality of bridges of the base; the first direction and the second direction are interlaced, the first direction and the first opening extending direction are interlaced, and the second direction and the second opening extending direction are interlaced; each of the first openings has a plurality of opposite first edges and a plurality of opposite second edges, the first edges are arranged in the first direction and the second edges are arranged in the first opening extending direction; and each of the second openings has a plurality of opposite third edges and a plurality of fourth edges, the third edges are arranged in the second direction, and the fourth edges are arranged in the second opening extending direction; and
a component layer, disposed on the base and comprising:
a plurality of island portions, having a plurality of pixel structures and respectively disposed on the islands of the base, wherein each of the plurality of pixel structures includes a first transistor and a pixel electrode, the first transistor has a first terminal, a second terminal, a control terminal and a semiconductor pattern, the first terminal and the second terminal are respectively electrically connected to two different regions of the semiconductor pattern, the pixel electrode is electrically connected to the second terminal of the first transistor, and a first insulating layer is sandwiched between the control terminal and the semiconductor pattern of the first transistor; and
a plurality of bridge portions, having a plurality of conductive wires and respectively disposed on the bridges of the base, wherein the conductive wires are electrically connected to the pixel structures;
the islands of the base comprise a first island and a second island arranged in the first direction;
the bridges of the base comprise a first bridge connecting the first island and the second island;
the island portions of the component layer comprise a first island portion and a second island portion respectively disposed on the first island and the second island of the base, and respectively having a first pixel structure and a second pixel structure of the pixel structures;
the bridge portions of the component layer comprise a first bridge portion disposed on the first bridge of the base and connecting the first island portion and the second island portion of the component layer; and the first bridge portion of the component layer has a first conductive wire of the conductive wires, and the first conductive wire electrically connects the first pixel structure and the second pixel structure;
a first edge of a first opening of the base has a first segment defining the first island of the base;
the first island portion of the component layer has an edge adjacent to the first opening, wherein the edge of the first island portion of the component layer refers to an edge of the first insulating layer; and
the first segment of the first edge of the first opening of the base and the edge of the first island portion of the component layer have a first distance in the first direction, and the first distance gradually increases closer to the first bridge of the base.

2. The stretchable pixel array substrate according to claim 1, wherein the first segment of the first edge of the first opening and the edge of the first island portion of the component layer have an acute angle θ1.

3. The stretchable pixel array substrate according to claim 1, wherein the first distance is greater than 3 μm.

4. The stretchable pixel array substrate according to claim 1, wherein the islands of the base further comprise a third island, and the first island and the third island are arranged in the second direction; the island portions of the component layer further comprise a third island portion disposed on the third island of the base and having a third pixel structure of the pixel structures; the bridges of the base comprise a second bridge connecting the first island and the third island of the base; the bridge portions of the component layer further comprise a second bridge portion disposed on the second bridge of the base and connecting the first island portion and the third island portion of the component layer; the second bridge portion of the component layer has a second conductive wire of the conductive wires, and the second conductive wire electrically connects the first pixel structure and the third pixel structure; the first edge of the first opening further comprises a second segment, and the second segment of the first edge of the first opening and a fourth edge of a second opening define the second bridge of the base; and the second segment of the first edge of the first opening and an edge of the second bridge portion of the component layer have a second distance, and the first distance is greater than the second distance.

5. The stretchable pixel array substrate according to claim 4, wherein the second distance is less than 5 μm.

6. The stretchable pixel array substrate according to claim 4, wherein the second segment of the first edge of the first opening comprises a curve.

7. The stretchable pixel array substrate according to claim 1, wherein a second edge of the first opening comprises a curve.

8. The stretchable pixel array substrate according to claim 1, wherein a fourth edge of a second opening comprises a curve.

9. The stretchable pixel array substrate according to claim 1, wherein one of the conductive wires is linear or curved.

10. A stretchable pixel array substrate, comprising:
a base, having a plurality of first openings and a plurality of second openings, wherein each of the first openings has a first opening extending direction, and each of the second openings has a second opening extending direction, and the first opening extending direction and the second opening extending direction are different; the first openings and the second openings are alternately arranged in a first direction and a second direction to define a plurality of islands and a plurality of bridges of the base; the first direction and the second direction are interlaced, the first direction and the first opening extending direction are interlaced, and the second direction and the second opening extending direction are interlaced; each of the first openings has a plurality of opposite first edges and a plurality of opposite second edges, the first edges are arranged in the first direction and the second edges are arranged in the first opening extending direction; and each of the second openings has a plurality of opposite third edges and a plurality of opposite fourth edges, the third edges are arranged in the second direction, and the fourth edges are arranged in the second opening extending direction; and a component layer, disposed on the base and comprising:
a plurality of island portions, having a plurality of pixel structures and respectively disposed on the islands of the base, wherein each of the plurality of pixel structures includes a first transistor and a pixel electrode, the first transistor has a first terminal, a second terminal, a control terminal and a semiconductor pattern, the first terminal and the second terminal are respectively electrically connected to two different regions of the semiconductor pattern, the pixel electrode is electrically connected to the second terminal of the first transistor, and a first insulating layer is sandwiched between the control terminal and the semiconductor pattern of the first transistor; and
a plurality of bridge portions, having a plurality of conductive wires and respectively disposed on the bridges of the base, wherein the conductive wires are electrically connected to the pixel structures;
the islands of the base comprise a first island and a second island arranged in the first direction;
the bridges of the base comprise a first bridge connecting the first island and the second island;
the island portions of the component layer comprise a first island portion and a second island portion respectively disposed on the first island and the second island of the base, and respectively having a first pixel structure and a second pixel structure of the pixel structures;
the bridge portions of the component layer comprise a first bridge portion disposed on the first bridge of the base and connecting the first island portion and the second island portion of the component layer; and
the first bridge portion of the component layer has a first conductive wire of the conductive wires, and the first conductive wire electrically connects the first pixel structure and the second pixel structure;
a first edge of a first opening of the base has a first segment defining the first island of the base;
the first island portion of the component layer has an edge adjacent to the first opening, wherein the edge of the first island portion of the component layer refers to an edge of the first insulating layer; and
the first segment of the first edge of the first opening of the base and the edge of the first island portion of the component layer have a first distance in the first direction, and the first distance gradually increases closer to the first bridge of the base;
wherein each of the bridges of the base is defined by a second edge of a corresponding first opening and a third edge of a corresponding second opening or is defined by a first edge of a corresponding first opening and a fourth edge of a corresponding second opening;
each of the bridge portions of the component layer is close to the third edge of the corresponding second opening and is away from the second edge of the corresponding first opening or is close to the first edge of the corresponding first opening and is away from the fourth edge of the corresponding second opening edge; and
the pixel array substrate further comprises a plurality of reinforcing structures disposed on the bridges of the base and separated from the bridge portions of the component layer.

11. The stretchable pixel array substrate according to claim 10, wherein one of the plurality of reinforcing structures is disposed between the first bridge portion of the component layer and the second edge of the corresponding first opening.

12. The stretchable pixel array substrate according to claim 10, wherein a distance between one of the plurality of reinforcing structures and a second edge of the first opening in the second direction is greater than 3 μm.

* * * * *